United States Patent [19]

Van Osdol

[11] 4,099,623
[45] Jul. 11, 1978

[54] CIRCUIT BOARD STORAGE CART

[75] Inventor: Peter Van Osdol, Grosse Pointe Farms, Mich.

[73] Assignee: Panel Controls Corporation, Detroit, Mich.

[21] Appl. No.: 831,360

[22] Filed: Sep. 8, 1977

[51] Int. Cl.² .................. A47G 19/08; A47F 5/00; H02B 1/04
[52] U.S. Cl. ............................ 211/41; 211/184; 361/415
[58] Field of Search ............ 211/40, 41, 49, 134, 211/186–188, 162, 151, 184; 361/409, 415, 390, 399

[56] References Cited

U.S. PATENT DOCUMENTS

| 570,338 | 10/1896 | Reed | 211/41 |
|---|---|---|---|
| 2,088,741 | 8/1937 | Hanson | 211/41 |
| 2,468,513 | 4/1949 | Rider | 211/134 |
| 2,622,740 | 12/1952 | Evers | 211/41 |
| 3,220,557 | 11/1965 | Brandes | 211/40 |
| 3,258,650 | 6/1966 | Fiege | 361/415 |
| 3,567,035 | 3/1971 | Dudzik | 211/49 R X |

Primary Examiner—Roy D. Frazier
Assistant Examiner—Terrell P. Lewis
Attorney, Agent, or Firm—McGlynn and Milton

[57] ABSTRACT

A circuit board storage cart assembly for transfer of circuit boards between assembly or work stations. The cart has end frame members and cross frame members. The end frame members have swivel casters for mobility. A pair of opposed channel assemblies each having a plurality of corresponding left and right-hand L-shaped channels are paired so that each pair of channels may support a circuit board. The plurality of channels of each channel assembly are vertically connected by two outer posts adjacent and interconnecting the outward ends of the channels and a middle post interconnecting the inner ends of each channel. Each channel has two sloping portions with each portion sloping downwardly at a five degree slope from the outer ends to an apex at the inner ends to define a "V" angle in order to prevent the delicate boards from inadvertently sliding out. The outer posts have stops adjacent their ends and the ends of the outer posts are disposed in a tubular member. The stops of the outer posts are engageable with the tubular member to limit the movement of the posts relative to the tubular members. The tubular members are attached to U-shaped clamps which are disposed about certain cross frame members and secured thereto by thumb screws. Thus, the channel assemblies can be attached at any one of various positions horizontally along the cross frame members so that the distance between channel assemblies may be changed to accommodate circuit boards of different sizes. Additional pairs of channels may be provided by interposing a double channel assembly between the original pair of opposed channel assemblies.

17 Claims, 7 Drawing Figures

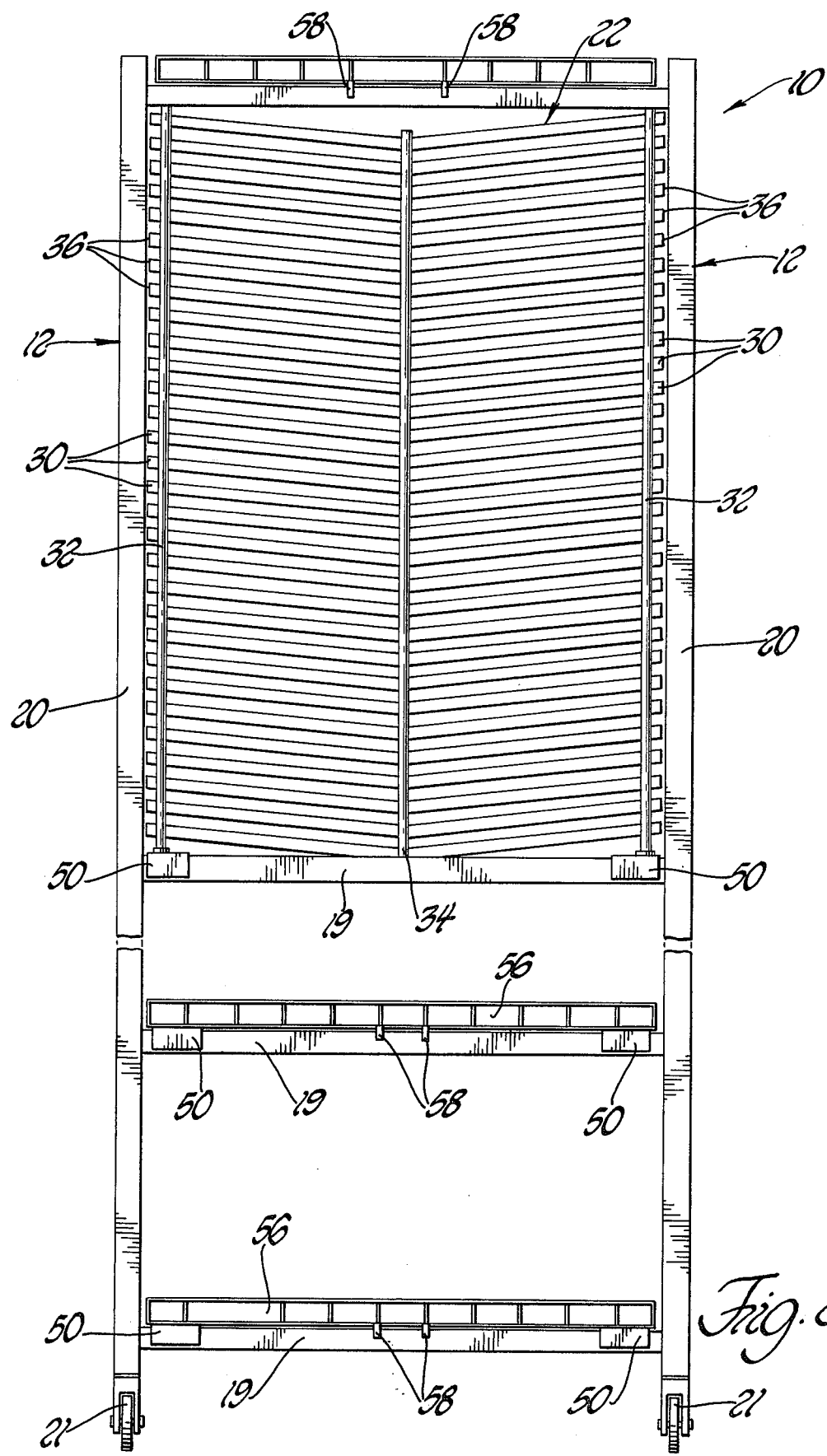

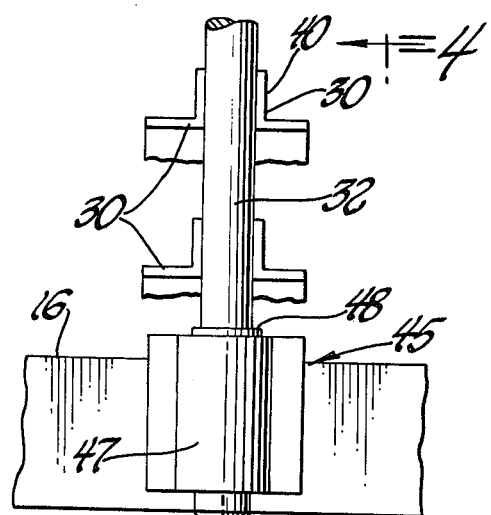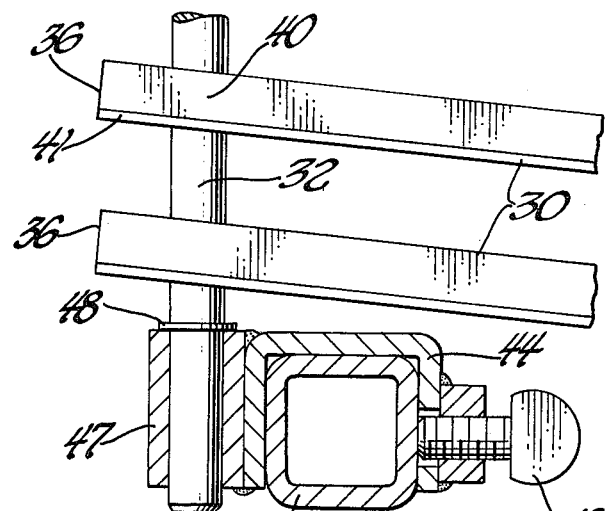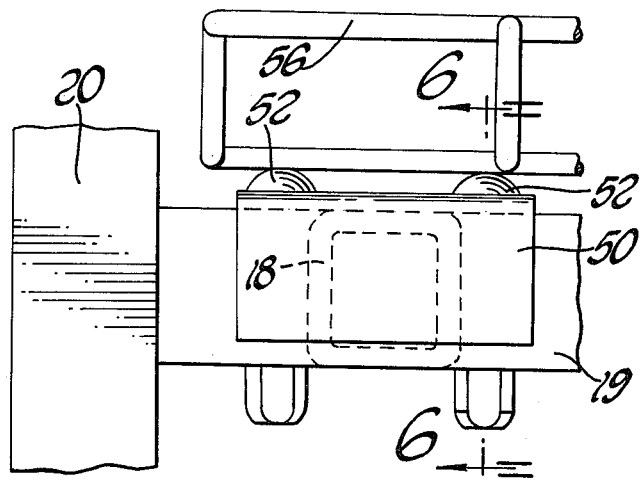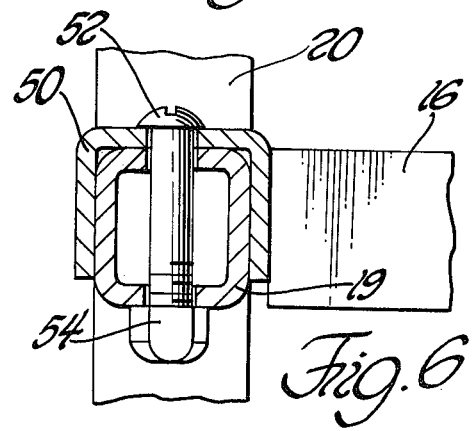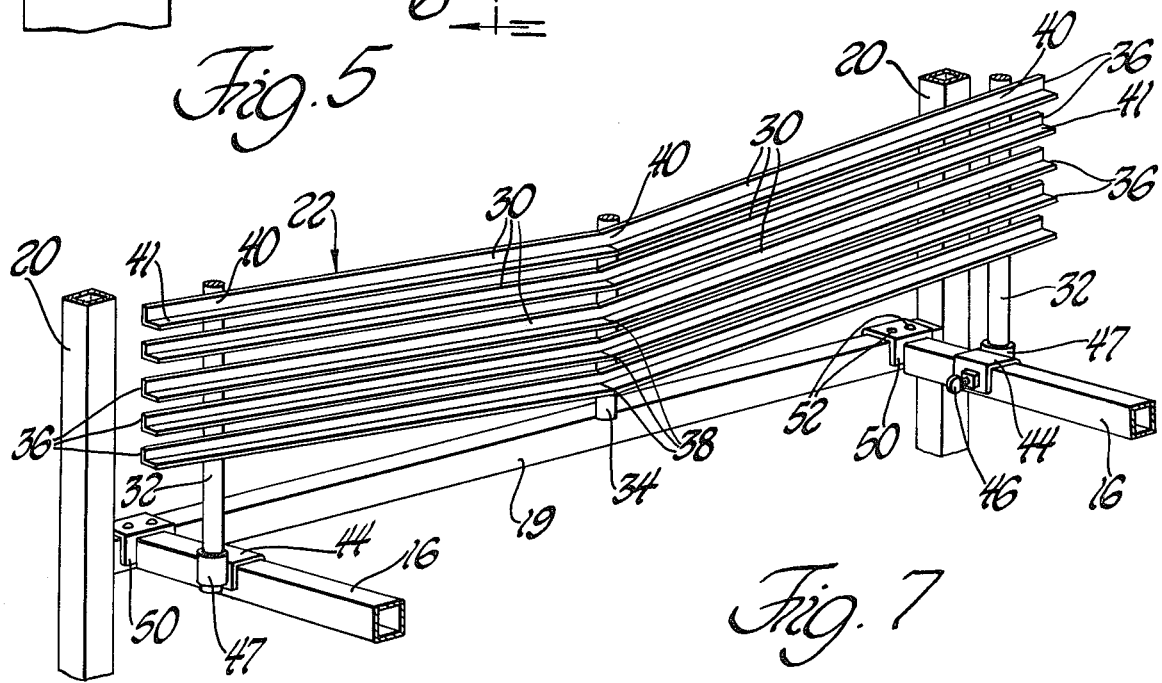

CIRCUIT BOARD STORAGE CART

BACKGROUND OF THE INVENTION

1. Field of the Invention

The subject invention relates to a circuit board storage cart to transfer circuit boards between assembly stations. The cart has storage channel assemblies with corresponding left and right-hand L-shaped channels which support the circuit boards. During the production/assembly process of circuit boards, the circuit boards are quite delicate and require careful handling during the complete assembly process from beginning, through insertion and wave soldering, to final inspection. Since the circuit boards are quite delicate, damage to the circuit boards often occurs during movement between assembly stations. Such circuit boards come in a wide variety of sizes. Thus, a circuit board storage and transfer cart must be adjustable in order to accommodate the wide variety of circuit board sizes. The cart must also provide easy insertion or removal of the delicate circuit boards from both sides of the cart but still prevent the boards from inadvertently sliding out.

2. Description of the Prior Art

Typically, prior art transfer carts are not specifically designed for storing and transferring circuit boards. Carts with columns of shelves do not provide for easy insertion or removal of delicate circuit boards and do not provide for preventing the boards from inadvertently sliding out.

SUMMARY OF THE INVENTION

The subject invention relates to a circuit board storage cart assembly comprising circuit board storage means for storing circuit boards and is supported by a frame. The circuit board storage means comprises a pair of opposed channel assemblies each having a plurality of channels. The channels are paired between the channel assemblies so that each pair of channels may support a circuit board. The channels have two sloping portions with the portions sloping downwardly from the outward ends thereof to an apex at the inner ends thereof. Each of the channel assemblies include connecting means for vertically interconnecting the plurality of channels. The connecting means includes two outer posts adjacent to and interconnecting the outward ends of the channels of each assembly and a middle post interconnecting the plurality of channels of each assembly at the apexes. As an additional feature, the channel assemblies may include adjustable attachment means for attachment to the frame so that the distance between the assemblies may be changed in order to accommodate circuit boards of different sizes. Further, additional double channel assemblies may be interposed between the original pair of opposed channel assemblies so that additional channels may be provided in order to store and transfer more circuit boards.

PRIOR ART STATEMENT

Cafeteria carts having a plurality of vertical shelves are known in the art. These carts, however, would not be suitable for the storage and transfer of circuit boards because they do not provide for the easy insertion and removal of the delicate boards and do not prevent the boards from inadvertently sliding off of the shelves during movement. In addition, cafeteria carts would not be compact nor convenient.

BRIEF DESCRIPTION OF THE DRAWINGS

Other advantages of the present invention will be readily appreciated as the same becomes better understood by reference to the following detailed description when considered in connection with the accompanying drawings wherein:

FIG. 2 is an elevational end view of the preferred embodiment;

FIG. 3 is an enlarged fragmentary view illustrating details of an outer post disposed in a tubular member;

FIG. 4 is a fragmentary cross-sectional view taken substantially along line 4—4 of FIG. 3;

FIG. 5 is a fragmentary view illustrating the connection between the end frame members and the cross frame members;

FIG. 6 is a fragmentary cross-sectional view taken substantially along line 6—6 of FIG. 5; and FIG. 7 is a perspective view partially broken away and in cross section of one end of the preferred embodiment.

DESCRIPTION OF PREFERRED EMBODIMENT

Figure 1:
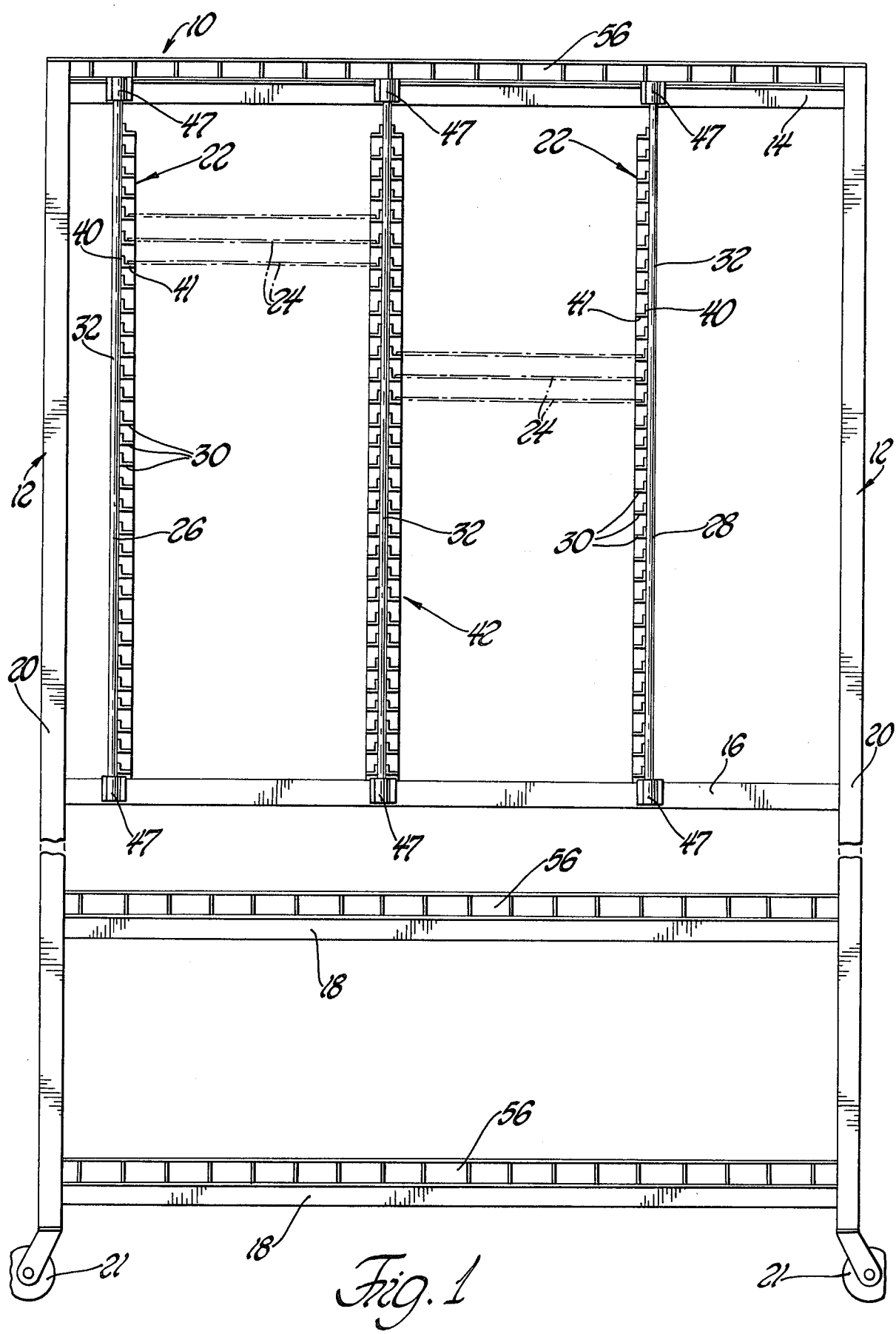
FIG. 1 is an elevational front or side view of a circuit board storage cart assembly constructed in accordance with the instant invention.

A circuit board storage cart assembly constructed in accordance with the subject invention is generally shown at 10. The frame of the assembly is comprised of end frame members, generaly indicated at 12 and cross frame members 14, 16 and 18 which connect the end frame members 12 from end to end as seen in FIG. 1. The end frames include horizontal members 19 which rigidly interconnect vertical posts 20. The end frame members 12 include swivel casters 21 which provide mobility.

Circuit board storage means for storing circuit boards 24 are generaly indicated at 22. Each of the circuit board storage means 22 is supported by the frame, and more particularly, is supported by cross frame members 14 and 16. Basically, the circuit board storage means 22 is comprised of a pair of opposed channel assemblies respectively shown at 26 and 28. Each of the channel assemblies 26 and 28 has a plurality of channels 30 which are L-shaped in cross section. The channel assemblies 26 and 28 are identical in that each assembly 26 and 28 has a single vertical row of channels. Each channel assembly 26 and 28 can be a left or right-handed assembly depending upon the direction of the channels 30 when the channel assemblies 26 or 28 are attached to the cross frame members 14 and 16.

Referring to FIGS. 2 and 7, each channel assembly 26 and 28 includes connecting means for vertically connecting the plurality of channels 30. The connecting means for each channel assembly includes two outer posts 32 which are adjacent to and interconnect the outward ends of the channels 30 of each assembly 26 and 28. The connecting means further includes a middle post 34 which interconnects the plurality of channels 30 of each assembly 26 and 28 at the middle of the channels 30, which defines an apex as will later be described in greater detail.

The plurality of channels 30 are set at a sloping angle relative to the horizontal. More specifically, each channel 30 includes two sloping portions with each of the portions sloping downwardly from their respective outward ends 36 to an apex 38 at the inner ends of the respective sloping portions. In other words, the middle of each channel 30 defines an apex 38 as illustrated in FIG. 7. Although many other variations are possible, the sloping portions of the channels 30 are set at a 5° slope which defines a "V" angle. In addition, the vertical distance between adjacent channels 30 of each assembly 26 and 28 is equal and is approximately 1 inch. Still referring to FIGS. 2 and 7, circuit boards can be stored on both sides of the cart, i.e., circuit boards can be stored on both sloping portions of the channels 30 when the channel assemblies 22 are paired.

Referring to FIG. 7, the vertical leg 40 of the L-shaped channels 30 is attached to the outer posts 32 and the middle post 34 by welding, brazing or the like. The horizontal leg 41 of the L-shaped channels 30 is used to support the circuit boards 24 as shown in FIG. 1. Still referring to FIG. 1, the channels 30 are paired between the channel assemblies 26 and 28 so that each pair of channels 30 and 30 may support a circuit board which would be twice the width of the circuit boards illustrated at 24. In other words, the channel assembly 26 has a plurality of left-hand channels while the channel assembly 28 has a plurality of right-hand channels. Thus, when the channels 30 are properly paired between the channel assemblies 26 and 28, the horizontal leg of 41 of the "L" of the channels 30 may support a circuit board.

The channel assemblies 26 and 28 each have a plurality of channels 30 attached to one side of the outer posts 32 and middle post 34. This forms a single channel assembly 26 or 28 which will have left or right-handed channels 30 depending upon which end of the cart the channel assembly 26 or 28 is attached thereto. As shown in FIG. 1, a double channel assembly generally indicated at 42 is interposed between the pair of opposed single channel assemblies 26 and 28. The double channel assembly 42 is a channel assembly which has a plurality of channels 30 on both sides of the outer posts 32 and middle post 34. This provides additional pairs of channels for supporting circuit boards when the channels 30 on one side of the double channel assembly 42 are paired with channels 30 on one of the first pair of opposed channel assemblies, i.e., single channel assembly 26, while the channels on the other side of the posts 32, 32 and 34 of the double channel assembly 42 are paired with the channels 30 on the other single channel assembly 28. It is also understood that even further additional pairs of channels may be provided by adding additional double channel assemblies 42 wherein channels on a double channel assembly 42 will be paired with channels on other double channel assemblies.

Each of the channel assemblies 26 and 28 and the double channel assembly 42 have attachment means for attachment to certain of the cross frame members 14 and 16 at any one of various positions horizontally along the cross frame members 14 and 16. This permits the distance between assemblies 26, 28 and 42 to be changed in order to accommodate circuit boards of different sizes. The attachment means includes a plurality of U-shaped clamps, one of which is indicated at 44 in FIG. 4. The U-shaped clamps 44 are disposed about the cross frame members 14 and 16 are illustrated. The attachment means further includes a thumb screw 46 threadedly associated with each clamp 44 through a nut welded to each bracket 44 for securing each clamp 44 in a fixed position along the associated cross frame member.

The outer posts 32 and the U-shaped clamp 44 are interconnected by support means. Referring to FIGS. 3, 4 and 7, the support means comprises a tubular member 47 which is attached to a U-shaped clamp 44 by welding, brazing, or the like. Each outer post 32 has a stop 48 adjacent its end with the end being disposed in a tubular member 47. The stops 48 are engageable with the tubular member 47 in order to limit the movement of the outer posts 32 and 32 relative to the tubular member 47. The stops 48 comprise snap rings, or the like, disposed in annular grooves in each post 32. Alternatively, the stops 48 may be washers welded to the posts.

Referring now to FIGS. 5, 6 and 7, there are brackets 50 for interconnecting the cross frame members 14, 16 and 18 to the members 19 of the end frames 12. Fastening means are included to secure each bracket 50 to appropriate frame members. The fastening means comprise a bolt 52 and a nut 54. This allows easy knockdown for shipping and storage.

Again referring to FIG. 1, there are also general storage assemblies 56 which are supported upon certain of the cross frame members 19. As best seen in FIG. 2, the general storage assemblies 56 are easily disposed on the frame by means of flanges 58 which merely extend over the cross frame tubing 19 which connect end frame members 12 on one end of the cart 10. Thus, this provides for storage for other components or finished circuit boards above and below the basic circuit board storage means 22.

Another desirable advantage provided by the present invention is that the channel spacing allows for many types of circuit boards since, when components are higher than 1 inch, the boards can be stored on alternate channel levels for needed separation to prevent contact. In addition, the circuit board storage means 22 provides access from both sides of the cart 10 for storage of circuit boards 24 on both sides of the cart.

The invention has been described in an illustrative manner, and it is to be understood that the terminology which has been used is intended to be in the nature of words of description rather than of limitation.

Obviously, many modifications and variations of the present invention are possible in light of the above teachings. It is, therefore, to be understood that within the scope of the appended claims, the invention may be practiced otherwise than as specifically described.

The embodiments of the invention in which an exclusive property or privilege is claimed are defined as follows:

1. A circuit board storage cart assembly comprising; a frame, circuit board storage means for storing circuit boards and supported by said frame, said circuit board storage means comprising a pair of opposed channel assemblies each having a plurality of channels so that said channels are paired between said assemblies so that each pair of channels may support a circuit board, said channels having two sloping portions with said portions sloping downwardly from the outward ends thereof to an apex at the inner ends thereof, and each of said channel assemblies including connecting means for vertically interconnecting said plurality of channels, said connecting means including two outer posts adjacent to and interconnecting said outward ends of said channels of each assembly and a middle post interconnecting said plurality of channels of each assembly at said apexes.

2. An assembly as set forth in claim 1 wherein said frame comprises end frame members and cross frame members.

3. An assembly as set forth in claim 2 wherein each of said channel assemblies include attachment means for attachment to certain of said cross frame members at any one of various positions horizontally along said cross frame members whereby the distance between said assemblies may be changed to accommodate circuit boards of different sizes.

4. An assembly as set forth in claim 3 wherein said attachment means comprises a plurality of U-shaped clamps disposed about said cross frame members.

5. An assembly as set forth in claim 4 wherein said attachment means further includes a thumb screw associated with each of said clamps for securing said clamps in fixed positions along said cross frame members.

6. An assembly as set forth in claim 5 including support means for connecting each of said outer posts to one of U-shaped clamps.

7. An assembly as set forth in claim 6 wherein the vertical distance between adjacent channels of each assembly is equal.

8. An assembly as set forth in claim 7 wherein the vertical distance between each of said channels is approximately 1 inch.

9. An assembly as set forth in claim 7 wherein said channel portions are set at a 5° slope to define a "V" angle.

10. An assembly as set forth in claim 6 wherein said support means comprises a tubular member attached to each of said U-shaped clamps, said outer posts having stops adjacent the ends thereof with said ends thereof being disposed in said tubular members with said stops being engageable with said tubular members to limit the movement of said posts relative to said tubular members.

11. An assembly as set forth in claim 10 including a bracket at each end of said cross frame members and fastening means securing said brackets to said end frame members.

12. An assembly as set forth in claim 11 wherein said end frame members include swivel casters.

13. An assembly as set forth in claim 12 including general storage assemblies attached to certain of said cross frame members.

14. An assembly as set forth in claim 11 wherein each of said channels is L-shaped in cross section.

15. An assembly as set forth in claim 1 including at least one double channel assembly interposed between said pair of opposed channel assemblies.

16. An assembly as set forth in claim 15 wherein said double channel assembly comprises a channel assembly having a plurality of channels facing in opposite directions whereby additional pairs of channels for supporting circuit boards are provided when said channels on said double channel assembly are paired with said first pair of opposed channel assemblies.

17. A circuit board storage cart assembly comprising; a frame having end frame members and cross frame members, circuit board storage means for storing circuit boards and supported by said frame, said circuit board storage means comprising at least one pair of opposed channel assemblies each having a plurality of channels so that said channels are paired between said assemblies so that each pair of channels may support a circuit board, said channels having two sloping portions with said portions sloping downwardly from the outward ends thereof to an apex at the inner ends thereof, said channel assemblies including attachment means for attachment to certain of said cross frame members at any one of various positions horizontally along said cross frame members whereby the distances between said assemblies may be changed to accommodate circuit boards of different sizes and connecting means for vertically interconnecting said plurality of said channels, said attachment means including a plurality of U-shaped clamps disposed about said cross frame members and a thumb screw associated with each of said clamps for securing said clamps in fixed positions along said cross frame members, said connecting means including two outer posts adjacent to and interconnecting said outward ends of said channels of each assembly and a middle post interconnecting said plurality of channels of each assembly at said apexes.

* * * * *